United States Patent
Nanki et al.

(10) Patent No.: US 7,130,952 B2
(45) Date of Patent: Oct. 31, 2006

(54) DATA TRANSMIT METHOD AND DATA TRANSMIT APPARATUS

(75) Inventors: Hidenori Nanki, Osaka (JP); Kenichi Kawaguchi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 216 days.

(21) Appl. No.: 10/765,993

(22) Filed: Jan. 29, 2004

(65) Prior Publication Data

US 2004/0186933 A1  Sep. 23, 2004

(30) Foreign Application Priority Data

Feb. 6, 2003  (JP)  ............................. P2003-029114

(51) Int. Cl.
    *G06F 13/40*  (2006.01)
    *G06F 13/12*  (2006.01)
    *G06F 13/16*  (2006.01)

(52) U.S. Cl. ........................ 710/307; 710/66

(58) Field of Classification Search .................. 710/66, 710/307
    See application file for complete search history.

(56) References Cited

U.S. PATENT DOCUMENTS 5,680,161 A * 10/1997 Lehman et al. ............. 345/531
5,768,546 A * 6/1998 Kwon .......................... 710/307
5,960,453 A * 9/1999 Pawlowski ................... 711/118
6,724,824 B1 * 4/2004 Otsuka et al. .......... 375/240.26
6,751,228 B1 * 6/2004 Okamura .................... 370/412
6,950,603 B1 * 9/2005 Isozaki et al. ................ 386/95
6,950,889 B1 * 9/2005 Ishida et al. .................. 710/65
2002/0118616 A1  8/2002 Fujiware et al.

OTHER PUBLICATIONS

Sound On Sound; "More Bits For Your Bucks", Sound on Sound; Oct. 1999; pp. 1-5.*
TerraTec; "SoundSystem DMX 6fire 24-96"; TerraTec; Nov. 26, 2001; p. 31.*
TerraTec; "AudioSystem EWS88MT The Ultimate MultiTracking solution"; TerraTec; May 25, 2000; p. 49.*

* cited by examiner

*Primary Examiner*—Paul R. Myers
*Assistant Examiner*—Ryan Stiglic
(74) *Attorney, Agent, or Firm*—McDermott Will & Emery LLP

(57) ABSTRACT

In an arrangement in which a CPU transmits data such as audio data through a 32-bit data bus, a format conversion device and a format conversion program are a are newly prepared. Further, input data having a first bit-width (32 bit width) is converted to output data having a second bit-width (24 bit width) in accordance with a predetermined system so that the efficiency of use of the bus at the time of transmitting data is improved; thus, it becomes possible to reduce a data memory area required for multi-media processes.

12 Claims, 12 Drawing Sheets

DATA TRANSMIT METHOD AND DATA TRANSMIT APPARATUS

BACKGROUND OF THE INVENTION

The present invention relates to a data transmission method and a data transmission apparatus which carry out data processing through a data bus.

In the case when a CPU carries out a data transmission process through a 32-bit bus, for example, upon carrying out audio data send/receive processes, when the audio data has a 16-bit width, reading and writing operations are carried out on higher-order and lower-order half words in a 32-bit register for every two data. When the data has a bit width of 18, 20, 24 or the like, reading and writing operations are carried out on a higher-order or lower-order bit in a 32-bit register for each data.

However, in the case of data having the bit width of 18, 20, 24 or the like, data in the higher-order or lower-order remaining bits (14, 12, 8 bit) is nullified. For this reason, the efficiency of use of a data bus interface used by the CPU is deteriorated. Moreover, since the CPU carries out encode/decode processes or the like on audio data, the efficiency of use of a memory for storing audio data is also deteriorated.

In the future, the CPU comes to carry out multi-media processes, such as audio, image and data processings, in portable terminals, digital cameras and the like. In these cases, one bus is shared by a number of interfaces so that it becomes essential to improve the efficiency of use of the bus.

SUMMARY OF THE INVENTION

Therefore, the main objective of the present invention is to improve the efficiency of use of a bus at the time of data transmission, which becomes more important in the future, and to reduce a data memory area required for a CPU to carry out multi-media processing. These objectives are not limited to audio data.

These and other objectives, features and advantages of the invention will be made clear by the following description.

In order to solve the above-mentioned problems, the present invention is provided with the following means. Basically, input data having a first bit width is converted to output data having a second bit width in accordance with a predetermined system. The following description discusses a plurality of constituent means; however, these means may be constituted by hardware or software, or may be constituted by a combination of hardware and software.

In accordance with a first aspect of the present invention, a data transmission method of the present invention, which processes data through an N-bit bus, is provided with the steps of: converting M-bit format data to N-bit format data; and transmitting the converted N-bit format data to a data processing device.

A data transmission apparatus corresponding to this data transmission method, which processes data through an N-bit bus, is provided with means which converts M-bit format data to N-bit format data and means which transmits the converted N-bit format data to a data processing device.

Here, the N-bit is typically exemplified by 32 bits. The M-bit is typically exemplified by 24 bits, 20 bits and 18 bits. However, these numbers of bits are only examples, and other numbers of bits maybe used. The M-bit is smaller than the N-bit. Normally, N is not divided by M with zero remainder. The data processing device receives external data inputs and externally outputs data (reproduces).

In the case when data, which is recorded and compressed/expanded in a memory on an M-bit basis, is transmitted to a data processing device through an N-bit bus, prior to the transmission, the M-bit format data is preliminarily format-converted to N-bit format data. The N-bit format data that has been format-converted is transmitted to a data processing device through an N-bit bus. The data transmitted through the N-bit bus is not M-bit format data, but N-bit format data. This method makes it possible to effectively utilize the N-bit bus to the full extent. In other words, the efficiency of use of the bus is highly improved.

In accordance with a second aspect of the present invention, a data transmission method of the present invention, which processes data through an N-bit bus, is provided with the steps of: transmitting N-bit format data from a data processing device; and converting the transmitted N-bit format data to M-bit format data.

A data transmission apparatus corresponding to this data transmission method, which processes data through an N-bit bus, is provided with means which transmits N-bit format data from a data processing device; and means which converts the transmitted N-bit format data to M-bit format data.

Here, the states of N-bit and M-bit are set in the same manner as described above. These are typically exemplified by N=32 and M=24.

In the case when N-bit format data, transmitted from a data processing device through an N-bit bus, is recorded or data-compressed in a main memory, the data is preliminarily format-converted to M-bit format data. Then, the M-bit format data that has been format-converted is recorded and data-compressed. The recording and data compressing processes are carried out on an M-bit basis. Here, upon receiving the data transmitted from the data processing device through the N-bit bus, the data is not M-bit format data, but N-bit format data. This method makes it possible to effectively utilize the N-bit bus to the full extent. In other words, the efficiency of use of the bus is highly improved.

In accordance with a third aspect of the present invention, a data transmit method of the present invention, which processes data through an N-bit bus, is provided with the steps of: converting N-bit format data to M-bit format data; and writing the M-bit format data that has been converted in a buffer memory.

A data transmission apparatus corresponding to this data transmission method, which processes data through an N-bit bus, is provided with means which converts N-bit format data to M-bit format data, and means which writes the M-bit format data that has been converted in a buffer memory.

Here, the states of N-bit and M-bit are set in the same manner as described above. These are typically exemplified by N=32 and M=24.

The data received by the data processing device through the N-bit bus is N-bit format data. However, upon externally outputting (reproducing) the data, the data processing device carries out parallel/serial conversions on the data on a M-bit basis. Therefore, the received N-bit format data is format-converted to M-bit format data. The resulting data is transmitted to a buffer memory, and further subjected to the parallel/serial conversions and the like.

In accordance with a fourth aspect of the present invention, a data transmission method of the present invention, which processes data through an N-bit bus, is provided with the steps of: reading M-bit format data from a buffer memory; and converting the M-bit format data thus read to N-bit format data.

A data transmission apparatus corresponding to this data transmission method, which processes data through an N-bit bus, is provided with means which reads M-bit format data from a buffer memory, and means which converts the M-bit format data thus read to N-bit format data.

Here, the states of N-bit and M-bit are set in the same manner as described above. These are typically exemplified by N=32 and M=24.

The data externally inputted to the data processing device and serial/parallel-converted is M-bit format data. The M-bit format data is written in a buffer memory. Further, the M-bit format data, read from the buffer memory, is format-converted to N-bit format data, and then transmitted to the N-bit bus.

In accordance with a fifth aspect of the present invention, upon converting the M-bit format data to the N-bit format data, the data transmission method of the present invention inputs first data constituted by first, second and third packets, second data constituted by fourth, fifth and sixth packets, third data constituted by seventh, eighth and ninth packets and fourth data constituted by tenth, eleventh and twelfth packets. Further, the data transmission method is provided with a first control process of outputting fifth data constituted by the first, fourth, second and fifth packets, a second control process of outputting sixth data constituted by the third and sixth packets; a third control process of outputting seventh data constituted by the seventh, tenth, eighth and eleventh packets; a fourth control process of outputting eighth data constituted by the ninth and twelfth packets; and a fifth control process of inputting the sixth data and the eighth data and outputting ninth data constituted by third, sixth, ninth and twelfth packets.

A data transmission apparatus corresponding to this data transmission method includes a conversion system from the M-bit format data to the N-bit format data which inputs first data constituted by first, second and third packets, second data constituted by fourth, fifth and sixth packets, third data constituted by seventh, eighth and ninth packets and fourth data constituted by tenth, eleventh and twelfth packets. Further, the conversion system is provided with a first control means which outputs fifth data constituted by the first, fourth, second and fifth packets, a second control means which outputs sixth data constituted by the third and sixth packets, a third control means which outputs seventh data constituted by the seventh, tenth, eighth and eleventh packets, a fourth control means which outputs eighth data constituted by the ninth and twelfth packets, and a fifth control means which receives the sixth data and the eighth data, and outputs ninth data constituted by third, sixth, ninth and twelfth packets.

In this case, the relationship between the M-bit and N-bit is represented by M:N=3:4. That is, the relationship is represented by, for example, 24 bits and 32 bits. When, upon sending data, the CPU executes a program for converting M-bit format data to N-bit format data, only 5 instructions need to be executed, thereby making it possible to reduce the load to be imposed on the CPU.

In accordance with a sixth aspect of the present invention, upon converting the N-bit format data to the M-bit format data, the data transmission method of the present invention inputs first data constituted by first, second, third and fourth packets, second data constituted by fifth, sixth, seventh and eighth packets, and third data constituted by ninth, tenth, eleventh and twelfth packets. Further, the data transmission method is provided with a first control process of outputting fourth data constituted by the first, fifth and second packets; a second control process of outputting fifth data constituted by the third, seventh and fourth packets; a third control process of inputting the second data and outputting sixth data constituted by the sixth, seventh and eighth packets after carrying out a shifting process to the right by one packet; a fourth control process of outputting seventh data constituted by the ninth, sixth and tenth packets; and a fifth control process of outputting eighth data constituted by the eleventh, eighth and twelfth packets.

A data transmission apparatus corresponding to this data transmission method includes a conversion system from the N-bit format data to the M-bit format data which inputs first data constituted by first, second, third and fourth packets, second data constituted by fifth, sixth, seventh and eighth packets, and third data constituted by ninth, tenth, eleventh and twelfth packets. Further, the conversion system is provided with a first control means which outputs fourth data constituted by the first, fifth and second packets, a second control means which outputs fifth data constituted by the third, seventh and fourth packets, a third control means which receives the second data, and outputs sixth data constituted by the sixth, seventh and eighth packets after carrying out a shifting process to the right by one packet, a fourth control means which outputs seventh data constituted by the ninth, sixth and tenth packets, and a fifth control means which outputs eighth data constituted by the eleventh, eighth and twelfth packets.

In this case, the relationship between the M-bit and N-bit is represented by M:N=3:4. That is, the relationship is represented by, for example, 24 bits and 32 bits. When, upon receiving data, the CPU executes a program for converting N-bit format data to M-bit format data, only five instructions need to be executed, thereby making it possible to reduce the load to be imposed on the CPU.

In accordance with a seventh aspect of the present invention, upon converting the N-bit format data to the M-bit format data, the data transmission method of the present invention is provided with a first data holding step of successively inputting first data constituted by first, second, third and fourth packets, second data constituted by fifth, sixth, seventh and eighth packets and third data constituted by ninth, tenth, eleventh and twelfth packets, and holding the first, second and third data. The data transmission method is also provided with a second data holding step of holding the fourth, eighth and twelfth packets. The method is further provided with a data selection step of: inputting the data held in the first data holding step; allowing the higher-order one packet to shift to the second data holding step; allowing the lower-order three packets of the first, second and third data to shift to a transmit control step as the fourth, fifth and sixth data; and when, upon completion of the processes, data corresponding to three packets has been stored in the second data holding step, switching processes to shift to the transmit control step with the data being used as the seventh data constituted by the fourth, eighth and twelfth packets. Moreover, the method is also provided with a transmit control step of successively transmitting the fourth, fifth, sixth and seventh data that have been shifted from the data selection process to a buffer memory area.

A data transmission apparatus corresponding to this data transmission method includes a conversion system from the N-bit format data to the M-bit format data which is provided with a first data holding means which successively receives first data constituted by first, second, third and fourth packets, second data constituted by fifth, sixth, seventh and eighth packets and third data constituted by ninth, tenth, eleventh and twelfth packets, and holds the first, second and third data. The system is also provided with a second data holding means which holds the fourth, eighth and twelfth packets. The system is further provided with a data selection means which receives the data held in the first data holding means, allows the higher-order one packet to shift to the second data holding means, allows the lower-order three packets of the first, second and third data to shift to a transmit control means as fourth, fifth and sixth data, and when, upon completion of the processes, data corresponding to three packets has been stored in the second data holding means, switches processes to shift to the transmit control means with the data being used as the seventh data constituted by the fourth, eighth and twelfth packets. Moreover, the system is also provided with a transmit control means which successively transmits the fourth, fifth, sixth and seventh data that have been outputted from the data selection means to a buffer memory area.

In this case, the relationship between the M-bit and N-bit is represented by M:N=3:4. That is, the relationship is represented by, for example, 24 bits and 32 bits. In an attempt to achieve an apparatus which, upon sending data, can convert N-bit format data to M-bit format data, the apparatus can be achieved by a small number of elements including only two registers, a transmit control means and a data selection means; thus, it becomes possible to prevent an increase in the LSI circuit scale.

In accordance with an eighth aspect of the present invention, upon converting the M-bit format data to the N-bit format data, the data transmission method of the present invention inputs first data constituted by first, second and third packets, second data constituted by fourth, fifth and sixth packets, third data constituted by seventh, eighth and ninth packets, and fourth data constituted by tenth, eleventh and twelfth packets. The data transmission method includes a transmit control step of allowing the sequence to successively proceed to a data selection step together with the first, second, third and fourth data. The method also includes a data selection step of: in the case when, among the data inputted at the transmit control step, the first data is inputted, allowing the sequence to proceed to the second data holding step, and in the case when the second, third and fourth data are inputted, respectively adding the first, second and third packets held at the second data holding step to the higher-order packets to form the fifth, sixth and seventh data, and allowing the sequence to proceed to the first data holding step. The method also includes a first data holding step of holding the fifth, sixth and seventh data outputted from the data selection step. The method further includes a second data holding step of holding the first data outputted at the data selection step.

A data transmission apparatus corresponding to this data transmission method includes a conversion system from the M-bit format data to the N-bit format data which inputs first data constituted by first, second and third packets, second data constituted by fourth, fifth and sixth packets, third data constituted by seventh, eighth and ninth packets, and fourth data constituted by tenth, eleventh and twelfth packets. The conversion system includes a transmit control means which successively transmits the first, second, third and fourth data to a data selection means. The conversion system also has an arrangement in which data is inputted from the transmit control means. The conversion system further includes the data selection means which, in the case when the first data is inputted, outputs the resulting data to the second data holding means, and in the case when the second, third and fourth data are inputted, respectively adds the first, second and third packets held in the second data holding means to the higher-order packets to form the fifth, sixth and seventh data so as to be outputted to the first data holding means. The conversion system also includes a first data holding means which receives and holds the fifth, sixth and seventh data outputted from the data selection means. The system further includes a second data holding means which receives and holds the first data outputted from the data selection means.

In this case, the relationship between the M-bit and N-bit is represented by M:N=3:4. That is, the relationship is represented by, for example, 24 bits and 32 bits. In an attempt to achieve an apparatus which, upon sending data, can convert N-bit format data to M-bit format data, the apparatus can be achieved by a small number of elements including only two registers, a transmit control means and a data selection means; thus, it becomes possible to prevent an increase in the LSI circuit scale.

In accordance with a ninth aspect of the present invention, a data transmission, which processes data through an N-bit bus, divides M-bit format data into packets of s-bits that correspond to the greatest common measure of M and N. The data transmission method is further provided with a multi-format conversion step of converting q-number of data having an M-bit format constituted by s bits×p packets to p-number of data having an N-bit format constituted by s bits×q packets, by using renumber of packets corresponding to the least common multiple of M÷s=p and N÷s=q as one unit.

In a data transmission apparatus corresponding to this data transmission method that processes data through an N-bit bus, M-bit format data is divided into packets of s-bits that correspond to the greatest common measure of M and N. The data transmission apparatus is further provided with a multi-format conversion means which converts q-number of data having an M-bit format constituted by s bits×p packets to p-number of data having an N-bit format constituted by s bits×q packets, by using r-number of packets corresponding to the least common multiple of M÷s=p and N÷s=q as one unit.

In accordance with a tenth aspect of the present invention, a data transmission method, which processes data through an N-bit bus, divides N-bit format data into packets of s-bits that correspond to the greatest common measure of M and N. The data transmission method is further provided with a multi-format conversion step of converting p-number of data having an N-bit format constituted by s bits×q packets to q-number of data having an M-bit format constituted by s bits×p packets, by using r-number of packets corresponding to the least common multiple of M÷s=p and N÷s=q as one unit.

In a data transmission apparatus corresponding to this data transmission method that processes data through an N-bit bus, N-bit format data is divided into packets of s-bits that correspond to the greatest common measure of N and M. The data transmission apparatus is further provided with a multi-format conversion means which converts p-number of data having an N-bit format constituted by s bits×q packets to q-number of data having an M-bit format constituted by s bits×p packets, by using r-number of packets corresponding to the least common multiple of M÷s=p and N÷s=q as one unit.

With this arrangement, data having a format with an arbitrary bit width can be converted to N-bit format data so that a multi-format converting process can be achieved.

With respect to the data to be used, the typical example is audio data. However, not limited to the audio data, the present invention is also applicable to other multi-media processings, such as audio, image and data processings, in portable terminals, digital cameras and the like. Thus, even in the case when one bus is shared by a number of interfaces, the efficiency of use of the bus at the time of transmitting data can be improved. Moreover, it is also possible to cut the data memory area required for the CPU to carry out multimedia processes.

The foregoing and other aspects will become apparent from the following description of the invention when considered in conjunction with the accompanying drawing figures.

BRIEF DESCRIPTION OF THE DRAWING FIGURES

In all these figures, like components are indicated by the same numerals.

DETAILED DESCRIPTION

Referring to Figures, the following description discusses preferred embodiments of a data transmission apparatus and a data transmission method in accordance with the present invention.

(Embodiment 1)

Figure 1:
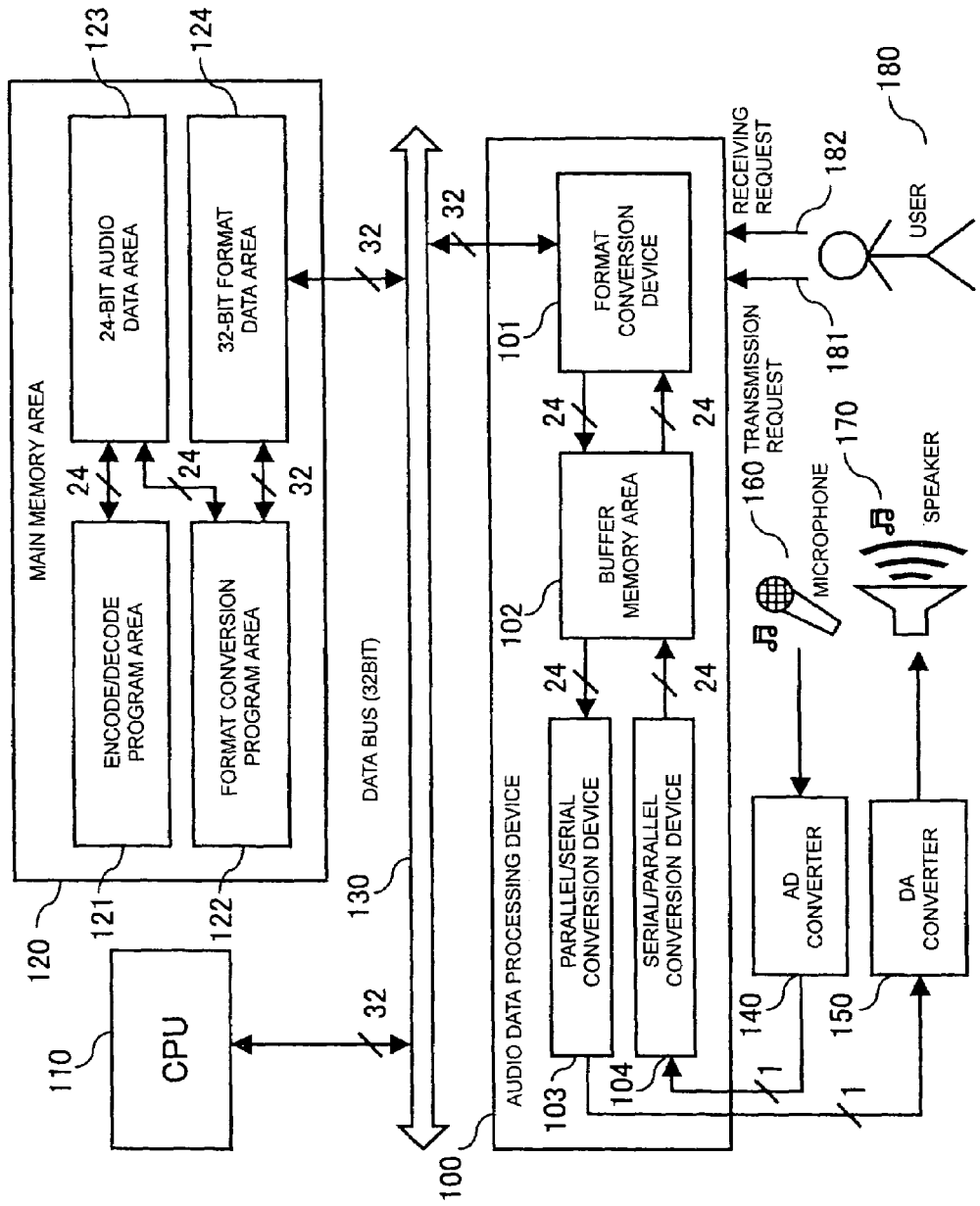
FIG. 1 is a block diagram that shows the entire structure of a data transmission apparatus in accordance with embodiment 1 of the present invention.

FIG. 1 is a block diagram that shows the entire structure of a data transmission apparatus in accordance with embodiment 1 of the present invention.

This data transmit apparatus is provided with an audio-data processing device 100, a CPU 110, a main memory area 120 and a data bus (32 bit) 130. The audio-data processing device 100 is constituted by a format conversion device 101, a buffer memory area 102, a parallel/serial conversion device 103 and a serial/parallel conversion device 104. The main memory area 120 is provided with an encode/decode program area 121, a format conversion program area 122, a 24-bit audio-data area 123 and a 32-bit format data area 124. Reference numeral 14 represents an AD converter, 150 represents a DA converter, 160 represents a microphone, 170 represents a speaker, 180 represents a user, 181 represents a transmission request and 182 represents a receiving request.

The audio-data processing device 100 is connected to the data bus (32 bit) 130.

The format conversion device 101 functions to convert 32-bit format data to 24-bit audio data, and then to output the resulting data to the buffer memory area 102. Moreover, it also functions to receive 24-bit audio data from the buffer memory area 102, and, after converting the data to 32-bit format data, to output the resulting data to the data bus 130. The buffer memory area 102 is a memory having a 24-bit width, and functions to store 24 bit audio data.

The parallel/serial conversion device 103 functions to convert 24-bit audio data inputted from the buffer memory area 102 to serial data, and to output the resulting data to the DA converter 150. The serial/parallel conversion device 104 functions to convert serial data inputted from the AD converter 140 to 24-bit audio data, and to output the resulting data to the buffer memory area 102.

The CPU 110, which is connected to the data bus (32 bit) 130, functions to carry out operations by using an encode/decode program and a format conversion program in the main memory area 120.

The main memory area 120, which is connected to the data bus (32 bit), is provided with an encode/decode program area 121, a format conversion program area 122, a 24-bit audio data area 123 and a 32-bit format data area 124.

The encode/decode program area 121 includes an encode program which compresses 24-bit audio data into a predetermined compression format such as an MP3 format, and a decode program which expands audio data compressed by using a predetermined compression format such as the MP3 format to 24-bit audio data.

The format conversion program are a 122 functions to receive 24-bit audio data from the 24-bit audio data area 123, and, after converting the data to 32-bit form at data, to output the resulting data to the 32-bit format data area 124. Moreover, it also functions to receive 32-bit format data from the 32-bit format data area 124, and, after converting the data to 24-bit audio data, to output the resulting data to the 24-bit audio data area 123.

The 24-bit audio data area 123 functions to record 24-bit audio data. The 32-bit format data area 124 functions to record 32-bit format data.

The data bus (32 bit) 130, which is a data bus having a 32-bit width, connects the audio data processing device 100 to the CPU 110 as well as to the main memory area 120.

The AD converter 140 converts voice inputted from the microphone 160 to serial data, and outputs the data to the serial/parallel conversion device 104. The DA converter 150 functions to convert serial data inputted from the parallel/serial conversion device 103 to voice, and to output the voice to the speaker 170. The microphone 160 receives voice inputted by the user, and outputs the voice to the AD converter 140. The speaker 170 functions to output voice inputted from the DA converter 150 to space. The user 180 inputs a transmission request 181 and a receiving request 182 to the audio data processing device 100, inputs voice to the microphone 160, and listens to voice outputted from the speaker 170. The transmission request 181 is a request signal that is inputted from the user 180 to the audio data processing device 100. Upon receipt of this signal, an audio data transmission flow is started. The receiving request 182 is a request signal that is inputted from the user 180 to the audio data processing device 100. Upon receipt of this signal, an audio data receiving flow is started.

Figure 7:
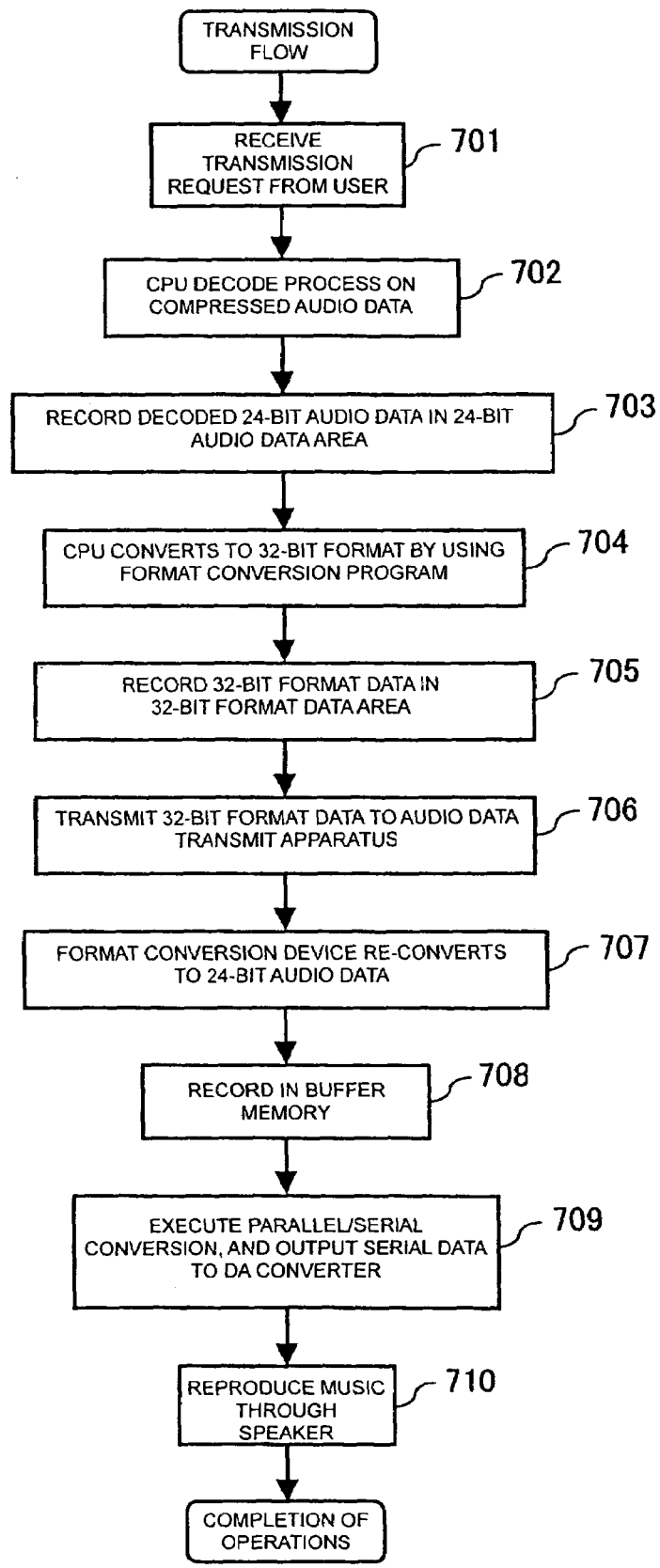
FIG. 7 is a flow chart that shows an example of transmitting operations of a data transmission apparatus in accordance with embodiment 1 of the present invention.

Referring to a flow chart shown in FIG. 7, the following description discusses an example of transmission operations in a data transmission apparatus in accordance with the present embodiment having the above-mentioned arrangement.

In a transmission request receiving process of step 701, the user 180 inputs a transmission request 181 to the audio data processing device 100.

Next, in a CPU audio decode process at step 702, by using a decode program stored in the encode/decode program area 121, the CPU 110 expands 24-bit audio data which has been read from the 24-bit audio data area 123, and compressed in a predetermined format.

In a 24-bit audio data recording process at step 703, the 24-bit audio data, decoded by the CPU audio decode process of step 702, is recorded in the 24-bit audio data area 123.

Next, in a 32-bit format conversion process at step 704, the 24-bit audio data is inputted from the 24-bit audio data area 123, and converted to 32-bit format data.

Next, in a 32-bit format data recording process at step 705, the 32-bit format data, converted by the 32-bit format conversion process at step 704, is recorded in a 32-bit format data area 124.

Next, in a 32-bit format data transmission process at step 706, the 32-bit format data, recorded in the 32-bit format data area 124, is transmitted to the audio data processing device 100.

In a 24-bit audio data conversion process at step 707, the 32-bit format data thus inputted is converted to 24-bit audio data, and outputted to the buffer memory area 102.

Next, in a buffer memory recording process at step 708, the 24-bit audio data, inputted from the format conversion device 101, is recorded in the buffer memory area 102.

Next, in a parallel/serial conversion process at step 709, the 24-bit audio data, inputted from the buffer memory area 102, is converted to serial data, and outputted to the DA converter 150.

Next, in a music reproducing process at step 710, the serial data, outputted through the parallel/serial conversion process 709, is converted to voice by the DA converter 150, and outputted to the speaker 170 so that the music is reproduced. The finish of this process completes the sequence of operations.

Figure 8:
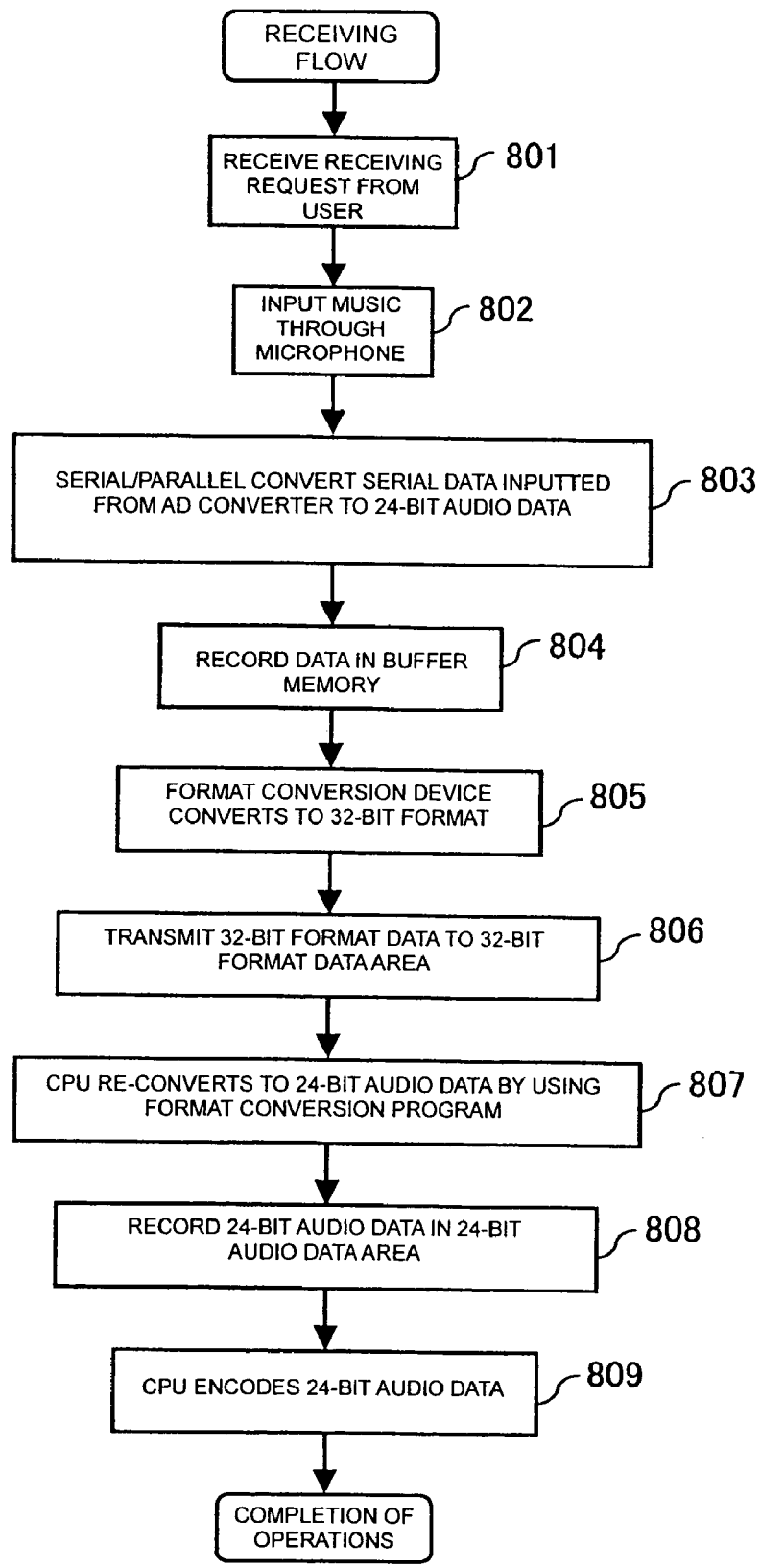
FIG. 8 is a flow chart that shows an example of receiving operations of the data transmission apparatus in accordance with embodiment 1 of the present invention.

Referring to a flow chart shown in FIG. 8, the following description discusses an example of receiving operations in the data transmission apparatus in accordance with the present embodiment.

In a receiving request receiving process at step 801, the user 180 inputs a receiving request 182 to the audio data processing device 100.

Next, in a music inputting process at step 802, the AD converter 140 converts voice inputted by the user 180 through the microphone 160 to serial data, and outputs the resulting data to the serial/parallel conversion device 104.

In a serial/parallel conversion process at step 803, the serial data, inputted from the AD converter 140, is converted to 24-bit audio data, and outputted to the buffer memory area 102.

Next, in a buffer memory recording process at step 804, the 24-bit audio data, inputted from the serial/parallel conversion device 104, is recorded in the buffer memory area 102.

In a 32-bit format conversion process at step 805, the 24-bit audio data, inputted from the buffer memory area 102, is converted to 32-bit format data.

Next, in a 32-bit format data transmission process at step 806, the 32-bit format data, converted by the 32-bit format conversion process at step 805, is transferred to the 32-bit format data area 124.

Next, in a 24-bit audio data conversion process at step 807, 32-bit format data is inputted from the 32-bit format data area 124, and converted to 24-bit audio data.

In a 24-bit audio data data-recording process at step 808, the 24-bit audio data, converted by the 24-bit audio data conversion process at step 807, is recorded in the 24-bit audio data area 123.

Next, in a CPU audio encode process at step 809, by using an encode program recorded in the encode/decode program area 121, the CPU 110 compresses the 24-bit audio data recorded in the 24-bit audio data area 123 to a predetermined format. The finish of this process completes the sequence of operations.

With the above-mentioned arrangement, in the audio data sending/receiving operations, when the 24-bit audio data is bus-transmitted, the transmitting process is carried out after the 24-bit audio data has been converted to 32-bit format data. This makes it possible to provide special effects for improving the efficiency of use of the bus.

(Embodiment 2)

Figure 2:
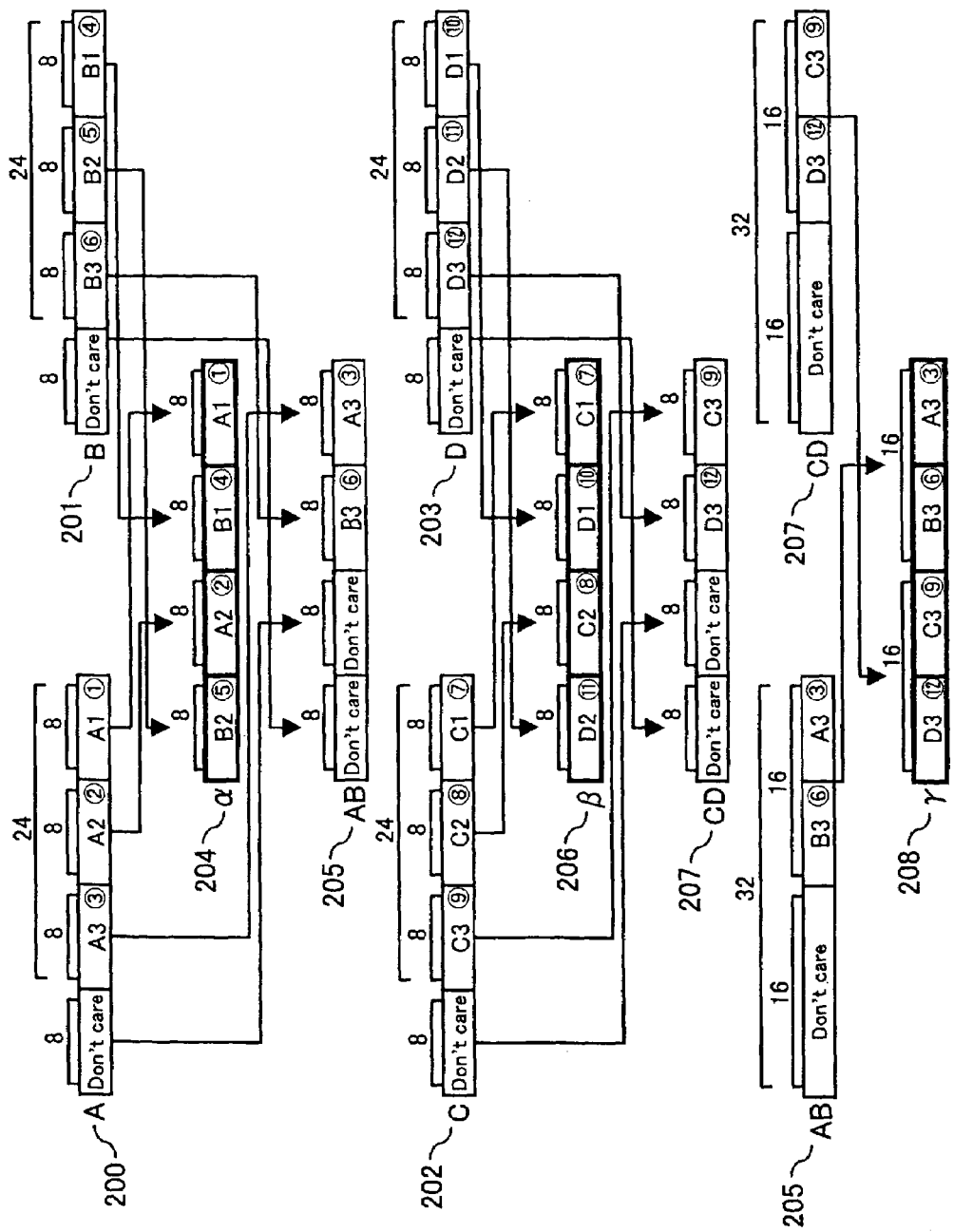
FIG. 2 is a conceptual drawing that shows operations of a transmitting conversion program in accordance with embodiment 2 of the present invention.

FIG. 2 is a conceptual drawing that shows operations of a transmitting conversion program in accordance with embodiment 2 of the present invention.

Data A 200 is 24-bit audio data constituted by packets of A1, A2 and A3, each having 8 bits. Data B 201 is 24-bit audio data constituted by packets of B1, B2 and B3, each having 8 bits. Data C 202 is 24-bit audio data constituted by packets of C1, C2 and C3, each having 8 bits. Data D 203 is 24-bit audio data constituted by packets of D1, D2 and D3, each having 8 bits. These data are inputted to a transmitting conversion program.

Data α204 is 32-bit format data constituted by packets of A1, B1, A2 and B2, each having 8 bits. This is outputted as the resulting data after operations using data A200 and data B201 as input data. Data AB 205 is constituted by packets of A3 and B3, each having 8 bits. This data is 32-bit format data with the higher-order 16 bits being defined as "Don't care", and outputted after operations carried out by using data A200 and B201 as input data. Data ββ206 is 32-bit format data constituted by packets of C1, D1, C2 and D2, each having 8 bits. This data β206 is outputted as the resulting data after operations using data C202 and data D203 as input data. Data CD 207 is constituted by packets of C3 and D3, each having 8 bits. This data is 32-bit format data with the higher-order 16 bits being defined as "Don't care", and outputted after operations carried out by using data C202 and D203 as input data. Data γ208 is 32-bit format data constituted by packets of A3, B3, C3 and D3, each having 8 bits. This data γ208 is outputted as the resulting data after operations using data AB205 and data CD207 as input data.

Figure 9:
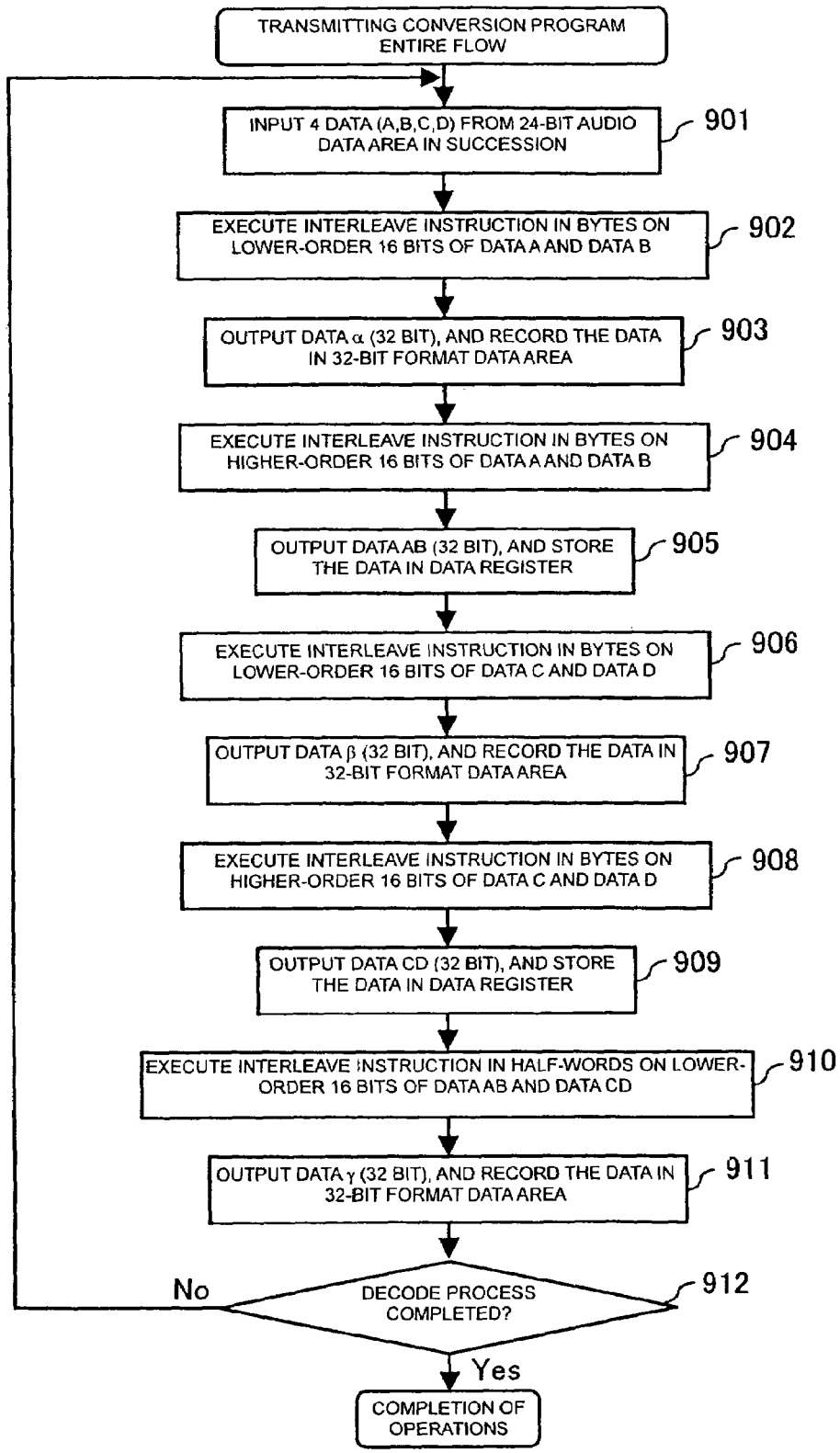
FIG. 9 is a flow chart that shows an example of operations of a transmitting conversion program of a data transmission apparatus in accordance with embodiment 2 of the present invention.

Referring to a flow chart shown in FIG. 9, the following description discusses an example of operations in the data transmission apparatus in accordance with the present embodiment.

In a data input process at step 901, data A200, data B201, data C202 and data D203 are inputted from the 24-bit audio data area 123.

Next, in a data A/B calculation process (1) at step 902, with respect to lower-order 16 bits of data A200 and data B201, an interleave instruction is executed on a byte basis so that data α204 is outputted. Successively, in a data α recording process at step 903, the data α204, outputted in the data A/B calculation process (1) at step 902, is recorded in the 32-bit format data area 124 ([1]).

Next, in a data A/B calculation process (2) at step 904, with respect to higher-order 16 bits of data A200 and data B201, an interleave instruction is executed on a byte basis so that data AB205 is outputted. Successively, in a data AB storing process at step 905, the data AB205, outputted in the data A/B calculation process (2) at step 904, is stored in a data register ([2]).

Next, in a data C/D calculation process (1) at step 906, with respect to lower-order 16 bits of data C202 and data D203, an interleave instruction is executed on a byte basis so that data β206 is outputted. Successively, in a data β recording process at step 907, the data β206, outputted in the data C/D calculation process (1) at step 906, is recorded in the 32-bit format data area 124 ([3]).

Next, in a data C/D calculation process (2) at step 908, with respect to higher-order 16 bits of data C202 and data D203, an interleave instruction is executed on a byte basis so that data CD207 is outputted. Successively, in a data CD storing process at step 909, the data CD207, outputted in the data C/D calculation process (2) at step 908, is stored in a data register ([4]).

Next, in a data AB/CD calculation process at step 910, with respect to lower-order 16 bits of data AB205 and data CD207, an interleave instruction is executed on a half-word basis so that data γ208 is outputted. Successively, in a data γ recording process at step 911, the data γ208, outputted in the data AB/CD calculation process at step 910, is recorded in the 32-bit format data area 124 ([5]).

In a decode completion determining process at step 912, it is determined whether or not the CPU audio decode process at step 702 of FIG. 7 has been completed. When this process has not been completed, the sequence proceeds to the data input process at step 901, and when it has been completed, the operations are completed.

With the above-mentioned arrangement, in the transmission operation of audio data, when the CPU executes the program for converting 24-bit audio data to 32-bit format data, only five instructions [1] to [5] are required. By properly designing the program in this manner, it becomes possible to provide specific effects for reducing the load imposed on the CPU.

(Embodiment 3)

Figure 3:
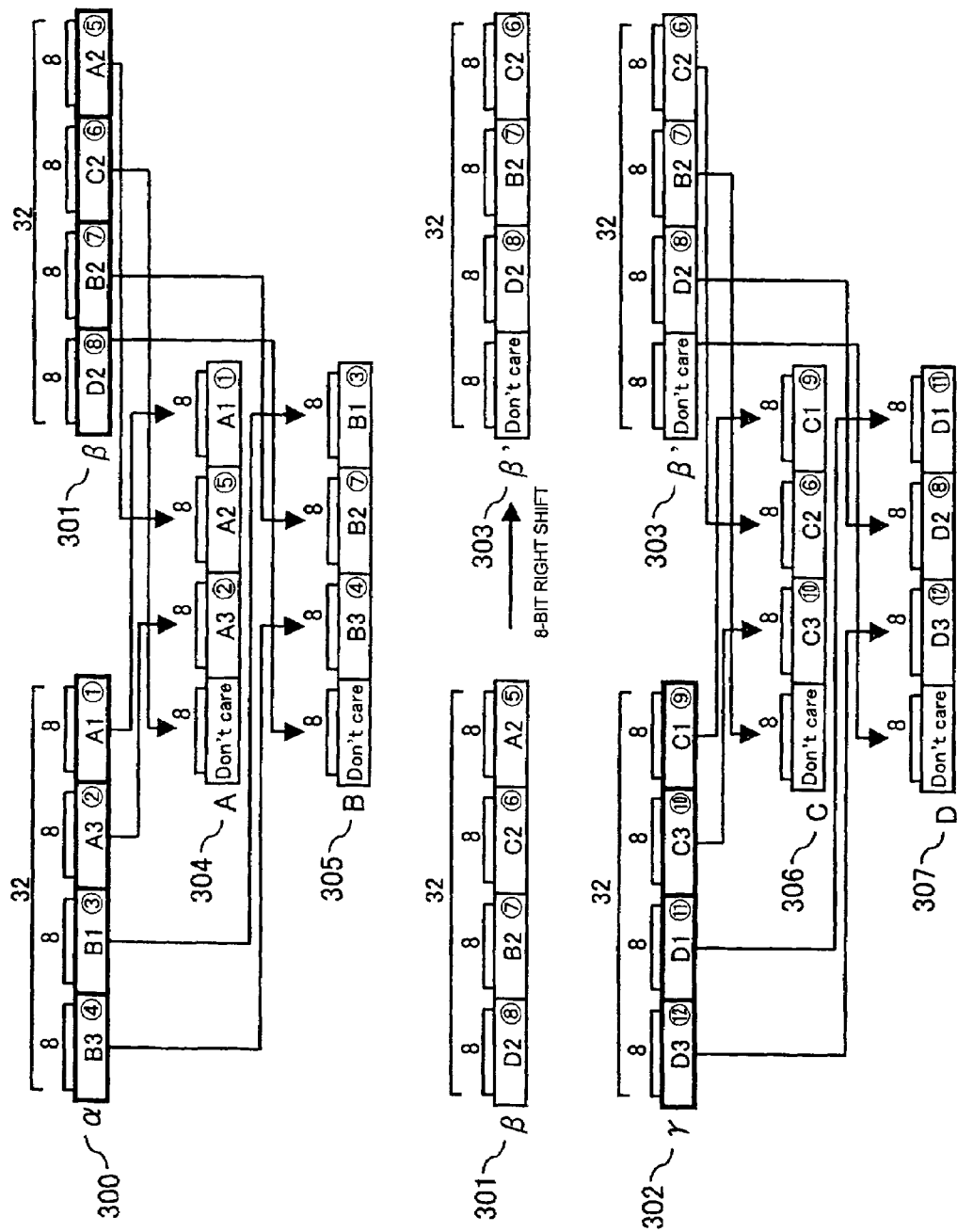
FIG. 3 is a conceptual drawing that shows operations of a receiving conversion program in accordance with embodiment 3 of the present invention.

FIG. 3 is a conceptual drawing that shows operations of a receiving conversion program in accordance with embodiment 3 of the present invention.

Data α300 is 32-bit format data constituted by packets of A1, A3, B1 and B3, each having 8 bits. Data β301 is 32-bit format data constituted by packets of A2, C2, B2 and D2, each having 8 bits. Data γ302 is 32-bit format data constituted by packets of C1, C3, D1 and D3, each having 8 bits. These data are inputted to a receiving conversion program.

Data β' 303 is constituted by packets of C2, B2 and D2, each having 8 bits. This data is 32-bit format data with the higher-order 8 bits being defined as "Don't care", and outputted after operations carried out by using data β301 as input data. Data A304 is constituted by packets of A1, A2 and A3, each having 8 bits. This data is 32-bit format data with the higher-order 8 bits being defined as "Don't care", and outputted after operations carried out by using data α300 and data β301 as input data. Data B305 is constituted by packets of B1, B2 and B3, each having 8 bits. This data is 32-bit format data with the higher-order 8 bits being defined as "Don't care", and outputted after operations carried out by using data α300 and data β301 as input data. Data C306 is constituted by packets of C1, C2 and C3, each having 8 bits. This data is 32-bit format data with the higher-order 8 bits being defined as "Don't care", and outputted after operations carried out by using data γ302 and data β' 303 as input data. Data D307 is 32-bit format data constituted by packets of D1, D2 and D3, each having 8 bits. This data D307 is outputted as the resulting data after operations using data γ302 and data β' 303 as input data.

Figure 10:
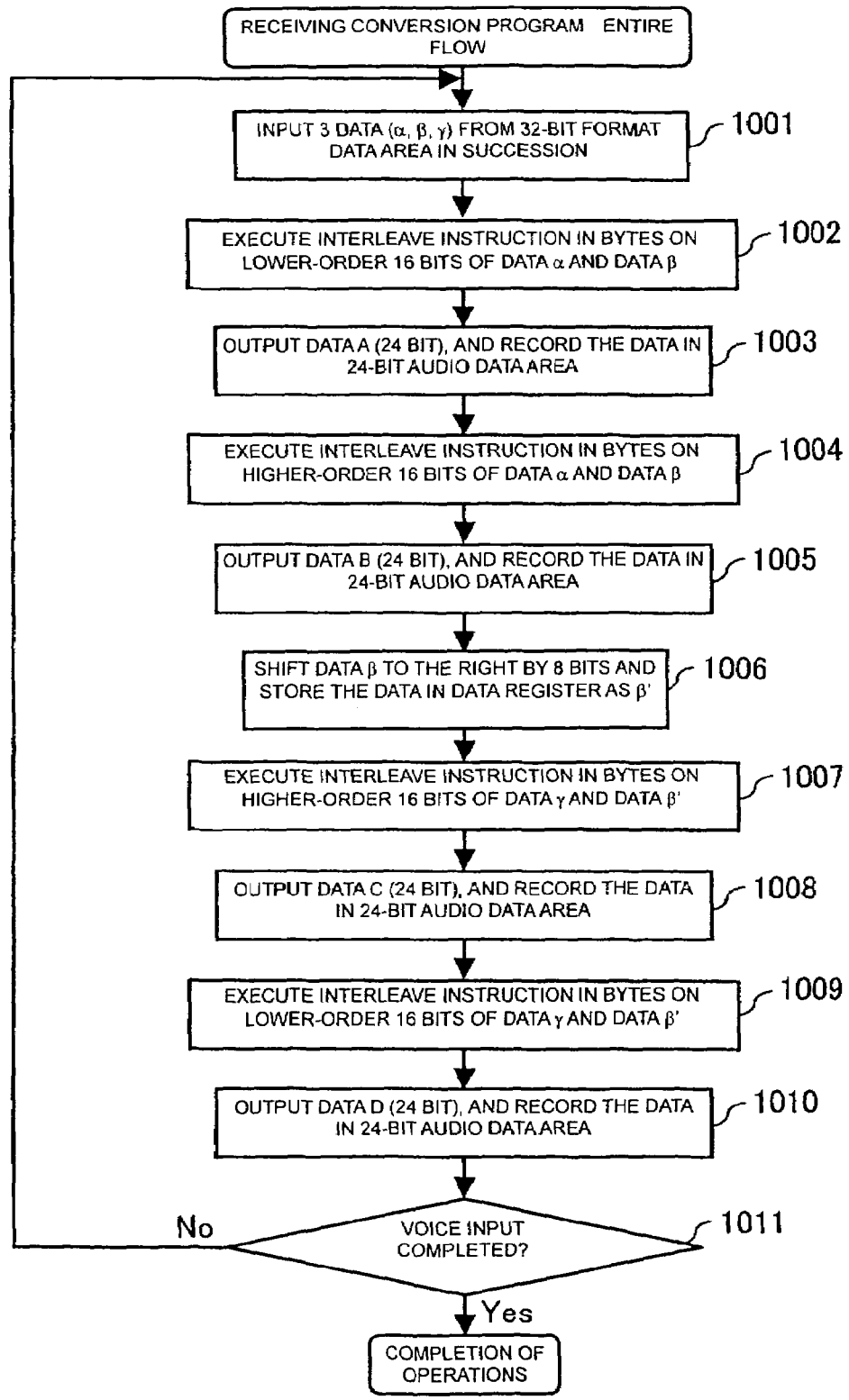
FIG. 10 is a flow chart that shows an example of operations of a receiving conversion program of a data transmission apparatus in accordance with embodiment 3 of the present invention.

Referring to a flow chart shown in FIG. 10, the following description discusses an example of operations in the data transmission apparatus in accordance with the present embodiment.

In a data input process at step 1001, data α300, data β301 and data γ302 are inputted from the 32-bit format data area 124.

Next, in a data α/β calculation process (1) at step 1002, with respect to lower-order 16 bits of data α300 and data β301, an interleave instruction is executed on a byte basis so that data A304 is outputted. Successively, in a data A recording process at step 1003, the data A304, outputted in the data α/β calculation process (1) at step 1002, is recorded in the 24-bit audio data area 123 ([1]).

Next, in a data α/β calculation process (2) at step 1004, with respect to higher-order 16 bits of data α300 and data β301, an interleave instruction is executed on a byte basis so that data B305 is outputted. Successively, in a data B recording process at step 1005, the data B305, outputted in the data α/β calculation process (2) at step 1004, is recorded in the 24-bit audio data area 123 ([2]).

Next, in a data β calculation process at step 1006, an instruction for shifting data β301 to the right by 8 bits is executed to output data β' 303 ([3]).

Next, in a data γ/β' calculation process (1) at step 1007, with respect to higher-order 16 bits of data γ302 and data β' 303, an interleave instruction is executed on a byte basis so that data C306 is outputted. Successively, in a data C recording process at step 1008, the data C306, outputted at the data γ/β' calculation process (1) at step 1007, is recorded in the 24-bit audio data area 123 ([4]).

Next, in a data γ/β' calculation process (2) at step 1009, with respect to lower-order 16 bits of data γ302 and data β' 303, an interleave instruction is executed on a byte basis so that data D307 is outputted. Successively, in a data D recording process at step 1010, the data D307, outputted at the data γ/β' calculation process (2) at step 1009, is recorded in the 24-bit audio data area 123 ([5]).

In a voice-input completion determining process at step 1011, it is determined whether or not the music inputting process at step 802 of FIG. 8 has been completed. When this process has not been completed, the sequence proceeds to the data input process at step 1001, and when it has been finished, the operations are completed.

With the above-mentioned arrangement, in the receiving operation of audio data, when the CPU executes the program for converting 32-bit format data to 24-bit audio data, only five instructions [1] to [5] are required. By properly designing the program in this manner, it becomes possible to provide specific effects for reducing the load imposed on the CPU.

(Embodiment 4)

Figure 4:
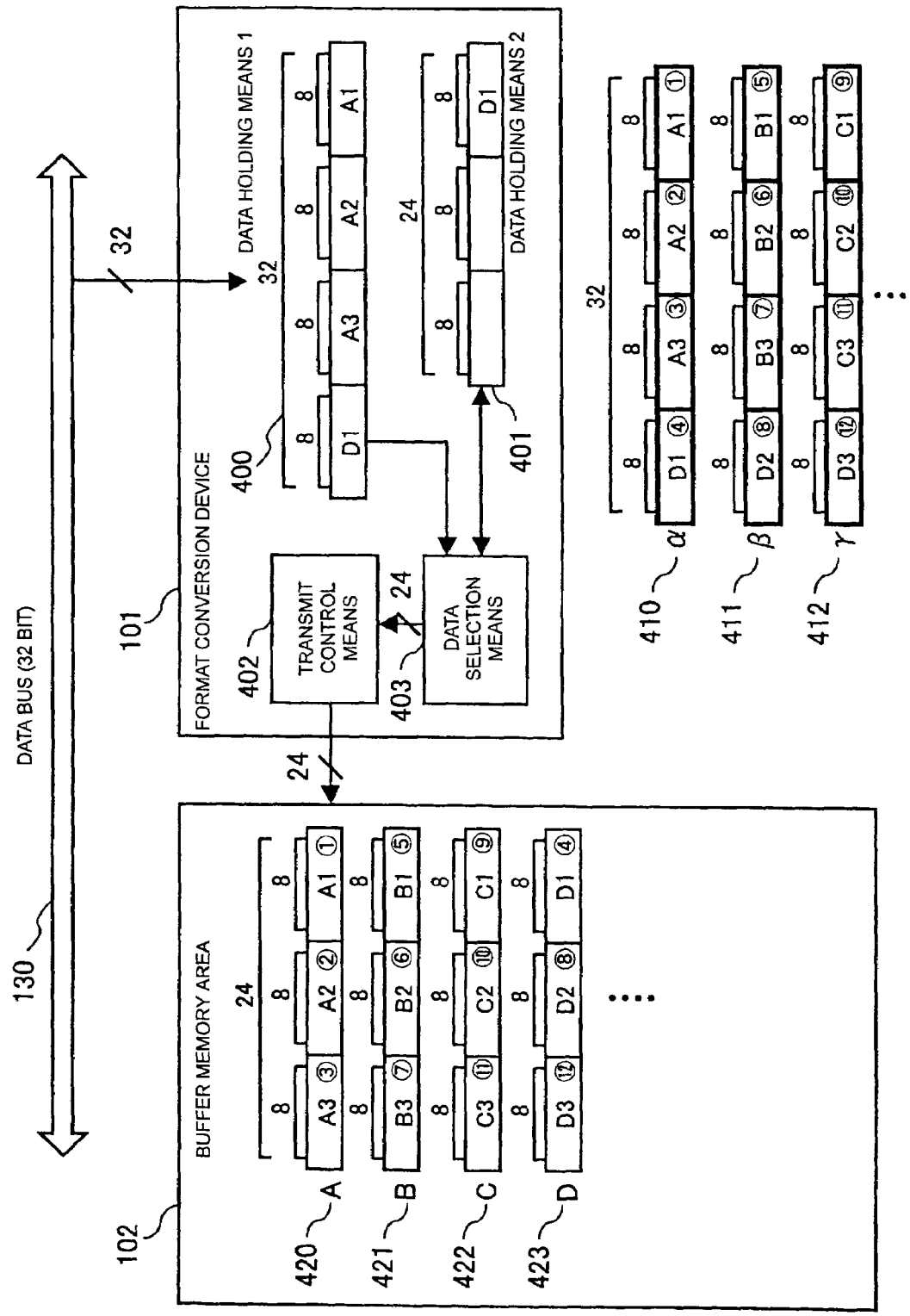
FIG. 4 is a conceptual drawing that shows a transmitting conversion device in accordance with embodiment 4 of the present invention.

FIG. 4 is a conceptual drawing that shows a transmitting conversion device in accordance with embodiment 4 of the present invention. In this Figure, the same blocks as those in FIG. 1 explained in embodiment 1 are indicated by the same reference numerals, and the description thereof is omitted.

A format conversion device 101 is constituted by a data holding means (1) 400, a data holding means (2) 401, a transmit control means 402 and a data selection means 403.

The data holding means (1) 400 is a register having a 32-bit width, and functions to hold data that is inputted to the format conversion device 101. The data holding means (2) 401 is a register having a 24-bit width, and functions to hold the higher-order 8 bits of the data holding means (1) 400 selected by the data selection means 403 in succession from the lower-order bits.

The transmit control means 402 functions to transmit 24-bit audio data selected by the data selection means 403 to a buffer memory area 102 in succession. The data selection means 403 functions to transmit the lower-order 24 bits of the data holding means (1) 400 to the transmit control means 402, and also to transmit the higher-order 8 bits thereof to the data holding means (2) 401. Moreover, it also has such a function that, when data corresponding to three packets has stored in the data holding means (2) 401, 24-bit data of the data holding means (2) 401 is transmitted to the transmit control means 402.

Data α410 is 32-bit format data constituted by packets of A1, A2, A3 and D1, each having 8 bits. Data β411 is 32-bit format data constituted by packets of B1, B2, B3 and D2, each having 8 bits. Data γ412 is 32-bit format data constituted by packets of C1, C2, C3 and D3, each having 8 bits. These data are inputted to the transmit conversion apparatus.

Data A420 is 24-bit audio data constituted by packets of A1, A2 and A3, each having 8 bits. Data B421 is 24-bit audio data constituted by packets of B1, B2 and B3, each having 8 bits. Data C422 is 24-bit audio data constituted by packets of C1, C2 and C3, each having 8 bits. Data D423 is 24-bit audio data constituted by packets of D1, D2 and D3, each having 8 bits. These data are transmitted to a buffer memory area 102 by the transmit control means 402.

Figure 11:
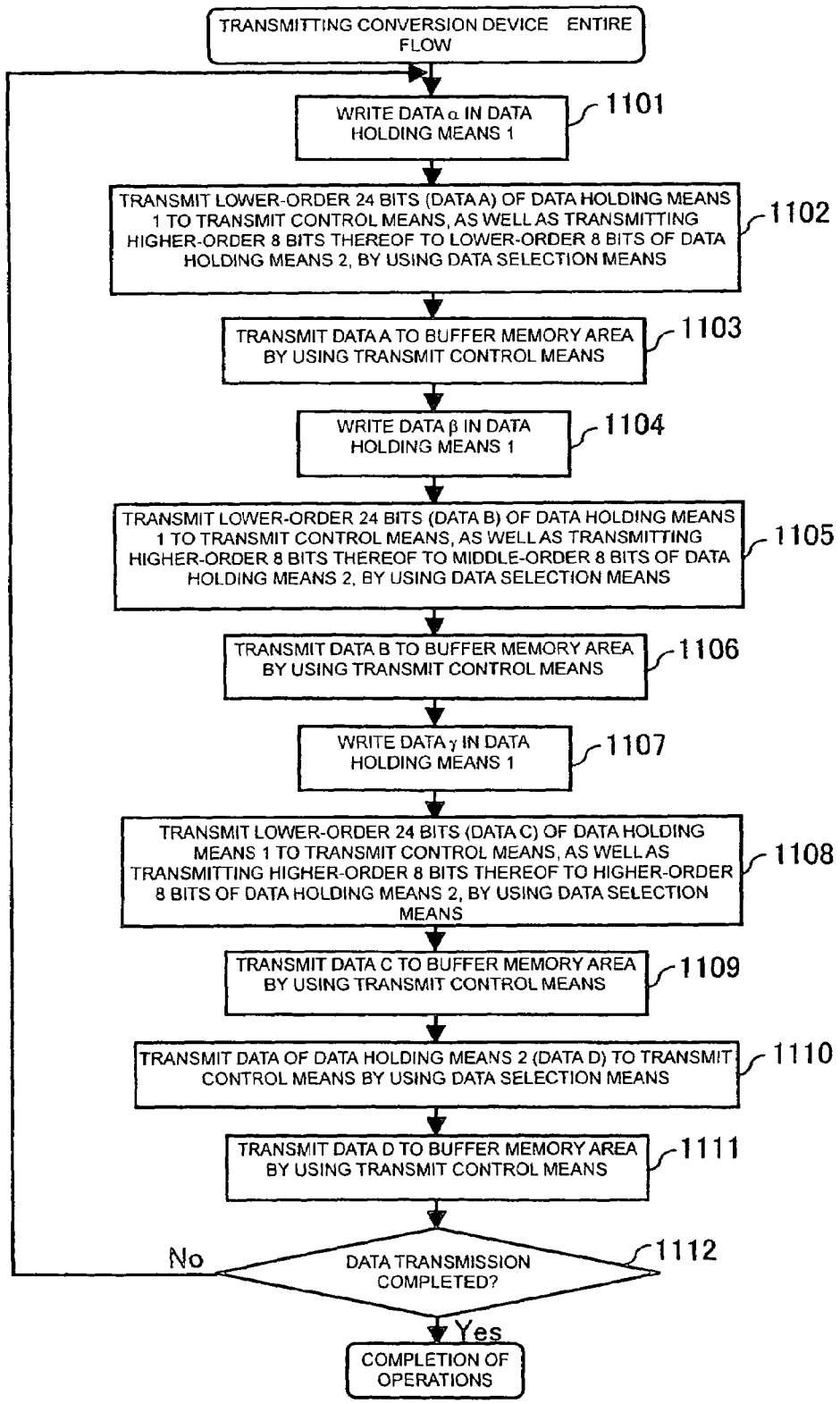
FIG. 11 is a flow chart that shows an example of operations of a transmitting conversion device in accordance with embodiment 4 of the present invention.

Referring to a flow chart shown in FIG. 11, the following description discusses an example of operations in the data transmit apparatus in accordance with the present embodiment.

In a data a input process at step 1101, data α410 is written in the data holding means (1) 400.

Next, in a data a selection process at step 1102, the lower-order 24 bits of the data holding means (1) 400 are transmitted to the transmit control means 402, while the higher-order 8 bits thereof are transmitted to the lower-order 8 bits of the data holding means (2) 401, by the data selection means 403.

Next, in a data A transmit process at step 1103, 24-bit audio data selected by the α selection process at step 1102 is transmitted to the buffer memory area 102.

In a data β input process at step 1104, data β 411 is written in the data holding means (1) 400.

Next, in a data β selection process at step 1105, the lower-order 24 bits of the data holding means (1) 400 are transmitted to the transmit control means 402, while the higher-order 8 bits thereof are transmitted to the middle-order 8 bits of the data holding means (2) 401, by the data selection means 403.

Next, in a data B transmit process at step 1106, 24-bit audio data selected by the β selection process at step 1105 is transmitted to the buffer memory area 102.

In a data γ input process at step 1107, data γ412 is written in the data holding means (1) 400.

Next, in a data γ selection process at step 1108, the lower-order 24 bits of the data holding means (1) 400 are transmitted to the transmit control means 402, while the higher-order 8 bits thereof are transmitted to the higher-order 8 bits of the data holding means (2) 401, by the data selection means 403.

Next, in a data C transmit process at step 1109, 24-bit audio data selected by the data γ selection process at step 1108 is transmitted to the buffer memory area 102.

Next, in a data D selection process at step 1110, 24-bit audio data of the data holding means (2) 401 is transmitted to the transmit control means 402 by the data selection means 403.

Next, in a data D transmit process at step 1111, 24-bit audio data selected by the data D selection process at step 1110 is transmitted to the buffer memory area 102.

In a transmission data completion determining process at step 1112, it is determined whether or not the 32-bit format data transmit process at step 706 of FIG. 7 has been completed. When this process has not been completed, the sequence proceeds to the data a input process at step 1101, and when it has been completed, the operations are completed.

With the above-mentioned arrangement, in an attempt to achieve a device which converts 32-bit format data to 24-bit audio data in the transmitting operation of audio data, the device can be achieved by using a small number of circuits including only the two registers, the transmit control means and the data selection means. By properly designing the device structure in this manner, it becomes possible to provide specific effects for preventing an increase in the LSI circuit scale.

(Embodiment 5)

Figure 5:
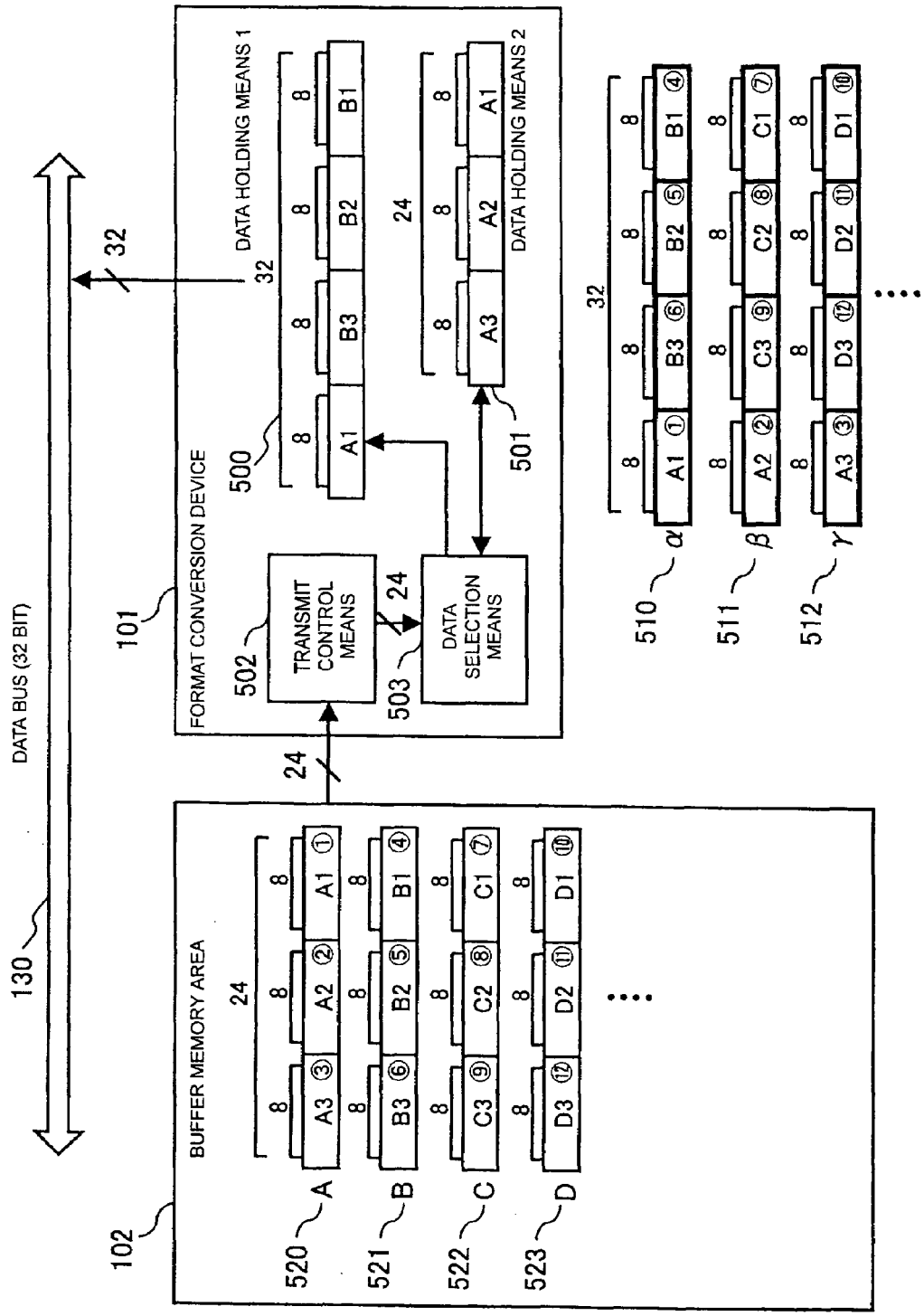
FIG. 5 is a conceptual drawing that shows a receiving conversion device in accordance with embodiment 5 of the present invention.

FIG. 5 is a conceptual drawing that shows a receiving conversion device in accordance with embodiment 5 of the present invention. In this Figure, the same blocks as those in FIG. 1 explained in embodiment 1 are indicated by the same reference numerals, and the description thereof is omitted.

A format conversion device 101 is constituted by a data holding means (1) 500, a data holding means (2) 501, a transmit control means 502 and a data selection means 503.

The data holding means (1) 500 is a register having a 32-bit width, and functions to hold data that is inputted to the data selection means 503. The data holding means (2) 501 is a register having a 24-bit width, and functions to hold data A520 that is selected by the data selection means 503.

The transmit control means 502 functions to successively receive 24-bit audio data from a buffer memory area 102, and to output the resulting data to the data selection means 503. In the case when the 24-bit audio data, inputted from the transmit control means 502, is data A520, the data selection means 503 transmits the data to the data holding means (2) 501, and in the case of data B521, data C522 and data D523, it adds each packet of A1, A2 and A3 that have been held in the dada holding means (2) to the higher-order bit of each of the data, and transmits the resulting data to the data holding means (1) 500.

Data α510 is 32-bit format data constituted by packets of B1, B2, B3 and A1, each having 8 bits. Data β511 is 32-bit format data constituted by packets of C1, C2, C3 and A2, each having 8 bits. Data γ512 is 32-bit format data constituted by packets of D1, D2, D3 and A3, each having 8 bits. These data are transmitted to a 32-bit format data area 124 from the format conversion device 101.

Data A520 is 24-bit audio data constituted by packets of A1, A2 and A3, each having 8 bits. Data B521 is 24-bit audio data constituted by packets of B1, B2 and B3, each having 8 bits. Data C522 is 24-bit audio data constituted by packets of C1, C2 and C3, each having 8 bits. Data D523 is 24-bit audio data constituted by packets of D1, D2 and D3, each having 8 bits. These data are inputted from the buffer memory area 102 by the transmit control means 502.

Figure 12:
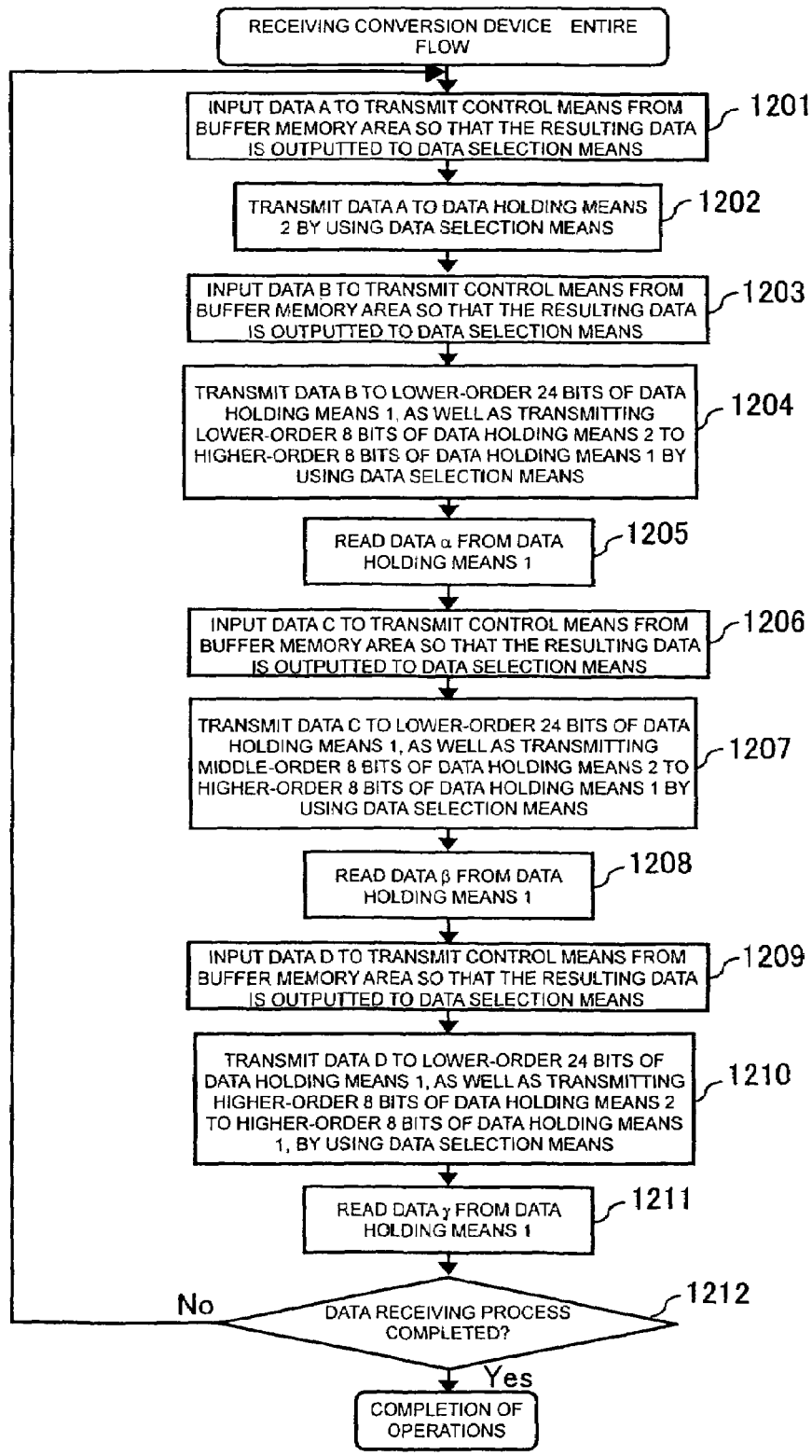
FIG. 12 is a flow chart that shows an example of operations of a receiving conversion device in accordance with embodiment 5 of the present invention.

Referring to a flow chart shown in FIG. 12, the following description discusses an example of operations in the data transmission apparatus in accordance with the present embodiment.

In a data A input process at step 1201, data A520 is inputted to the transmit control means 502 from the buffer memory area 102, and the resulting data is outputted to the data selection means 503.

Next, in a data A selection process at step 1202, the data A520 is transmitted to the data holding means (2) 501 from the data selection means 503.

In a data B input process at step 1203, data B521 is inputted to the transmit control means 502 from the buffer memory area 102, and the resulting data is outputted to the data selection means 503.

Next, in a data B selection process at step 1204, the data selection means 503 transmits data B521 to the lower-order 24 bits of the data holding means (1) 500, and also transmits the lower-order 8 bits of the data holding means (2) 501 to the higher-order 8 bits of the data holding means (1) 500.

Next, in a data α selection process at step 1205, data α510 is transmitted to the 32-bit format data area 124 from the data holding means (1) 500.

Next, in a data C input process at step 1206, data C522 is inputted to the transmit control means 502 from the buffer memory area 102, and the resulting data is outputted to the data selection means 503.

Next, in a data C selection process at step 1207, the data selection means 503 transmits data C522 to the lower-order 24 bits of the data holding means (1) 500, and also transmits the middle-order 8 bits of the data holding means (2) 501 to the higher-order 8 bits of the data holding means (1) 500.

Next, in a data β transmit process at step 1208, data β 511 is transmitted to the 32-bit format data area 124 from the data holding means (1) 500.

Next, in a data D input process at step 1209, data D523 is inputted to the transmit control means 502 from the buffer memory area 102, and the resulting data is outputted to the data selection means 503.

Next, in a data D selection process at step 1210, the data selection means 503 transmits data D523 to the lower-order 24 bits of the data holding means (1) 500, and also transmits the higher-order 8 bits of the data holding means (2) 501 to the higher-order 8 bits of the data holding means (1) 500.

Next, in a data γ transmit process at step 1211, data γ512 is transmitted to the 32-bit format data area 124 from the data holding means (1) 500.

In a receiving data completion determining process at step 1212, it is determined whether or not the buffer-memory recording process 804 has been completed. When this process has not been completed, the sequence proceeds to the data A input process at step 1201, and when it has been completed, the operations are completed.

With the above-mentioned arrangement, in an attempt to achieve a device which converts 32-bit format data to 24-bit audio data in the receiving operation of audio data, the device can be achieved by using a small number of circuits including only the two registers, the transmit control means and the data selection means. By properly designing the device structure in this manner, it becomes possible to provide specific effects for preventing an increase in the LSI circuit scale.

(Embodiment 6)

Figure 6:
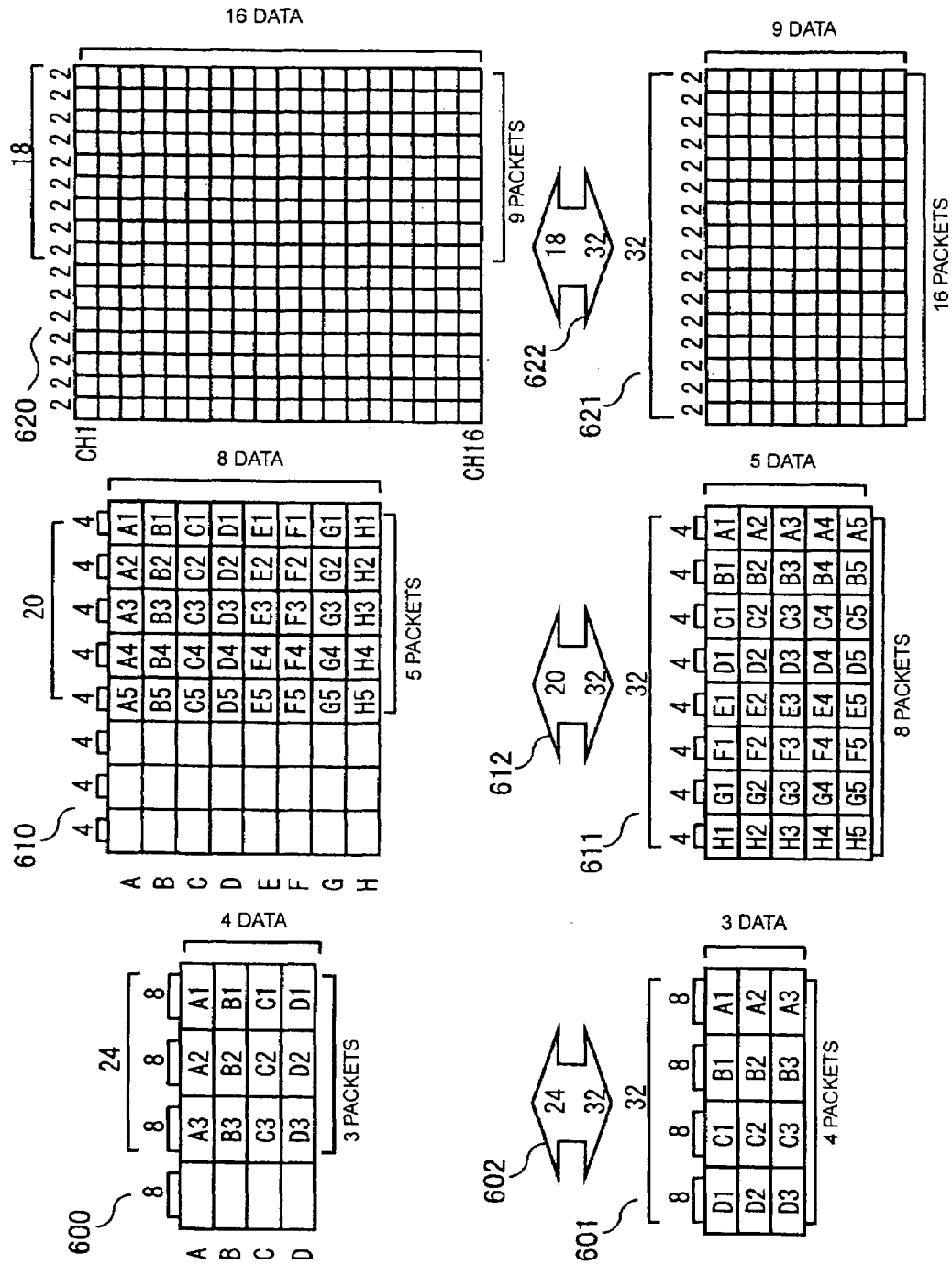
FIG. 6 is a conceptual drawing that shows a multi-format conversion method in accordance with embodiment 6 of the present invention.

FIG. 6 is a conceptual drawing that shows a multi-format conversion method in accordance with embodiment 6 of the present invention.

A 24-bit audio format 600 is provided with a unit corresponding to 4 data each of which is obtained by dividing 24-bit audio data into 8 bits×3 packets, and a 32-bit format (1) 601 is provided with a unit corresponding to 3 data each of which is 32-bit format data constituted by 8 bits×4 packets. A 24-bit format conversion method 602, which relates to a method for transmitting data through a 32-bit bus, divides 24-bit audio data into packets of 8 bits that correspond to the greatest common measure of 24 and 32. Here, this format conversion method carries out a mutual conversion process between 24 bits (3 packets)×4 data and 32 bits (4 packets)×3 data, by using 12 packets that correspond to the least common multiple of 24÷8=3 and 32÷8=4 as one unit.

A 20-bit audio format 610 is a unit corresponding to 8 data each of which is obtained by dividing 20-bit audio data into 4 bits×5 packets, and a 32-bit format (2) 611 is a unit corresponding to 5 data of 32-bit format data constituted by 4 bits×8 packets. A 20-bit format conversion method 612, which relates to a method for transmitting data through a 32-bit bus, divides 20-bit audio data into packets of 4 bits that correspond to the greatest common measure of 20 and 32. Here, this format conversion method carries out a mutual conversion process between 20 bits (5 packets)×8 data and 32 bits (8 packets)×5 data, by using 40 packets that correspond to the least common multiple of 20÷4=5 and 32÷4=8 as one unit.

A 18-bit audio format 620 is a unit corresponding to 16 data each of which is obtained by dividing 18-bit audio data into 2 bits×9 packets, and a 32-bit format (3) 621 is a unit corresponding to 9 data of 32-bit format data constituted by 2 bits×16 packets. A 18-bit format conversion method 622, which relates to a method for transmitting data through a 32-bit bus, divides 18-bit audio data into packets of 2 bits that correspond to the greatest common measure of 18 and 32. Here, this format conversion method carries out a mutual conversion process between 18 bits (9 packets)×16 data and 32 bits (16 packets)×9 data, by using 144 packets that correspond to the least common multiple of 18÷2=9 and 32÷2=16 as one unit.

With the above-mentioned arrangements, it is possible to achieve conversion methods of audio formats having 24, 20 and 18 bit widths to 32-bit format data. Moreover, with respect to audio data having another bit width, it is possible to achieve a conversion method based upon the same principle. In this manner, it is possible to obtain special effects for providing a format conversion method that is applicable to a multi-bit audio format.

Moreover, in the case of transmitting data through a 64-bit bus, the same principle as the above-mentioned conversion method can be used. By using twice the number of packets as one unit, it is possible to provide a format conversion method that is applicable to a multi-bit audio format data in the same manner.

As described above, in the embodiments of the present invention, when data is transmitted through a 32-bit bus, for example, during sending and receiving operations of audio data, the efficiency of use of the bus can be improved by converting 24-bit audio data to 32-bit format data upon transmission through the bus. Moreover, upon executing a program for the conversion, only the five instructions need to be executed. By properly designing the program in this manner, it is possible to reduce the load to be imposed on the CPU. Moreover, in an attempt to achieve a conversion device for carrying out the conversion, by designing the structure of the device so as to be formed by using a small number of circuits including only the two registers, transmit control means and data selection means, it becomes possible to prevent an increase in the scale of the LSI circuit. Furthermore, since an appropriate conversion method can be achieved for audio data having another bit width such as 24, 20 and 18 bit widths, it is possible to provide a conversion method that is applicable to a multi-bit audio format. Even in the case when data is transmitted through a 64-bit bus, it is possible to provide a conversion method that is applicable to a multi-bit audio format, by using the same principle as the 32-bit bus.

In summary, the following effects can be obtained: In the future, the multi-media industries are expected to be further developed in wider fields, and data-bus sharing that involves various pieces of application software is expected. Under these circumstances, by improving the efficiency of use of 32- and 64-bit peripheral data buses, more processes can be carried out simultaneously in parallel with each other. Moreover, it is also possible to cut the data memory area required for the CPU to carry out multi-media processes.

As described above, in accordance with the present invention, upon transmitting data through an N-bit bus, M-bit format data is preliminarily format-converted to N-bit format data prior to the transmission. Then, the N-bit format data that has been format-converted is transmitted through the N-bit bus. Thus, the N-bit bus can be effectively utilized to its full extent, and the efficiency of use of the bus can be improved.

Moreover, the program to be used for the conversion is designed in such a manner that only the five instructions are required upon executing the program; therefore, it becomes possible to reduce the load to be imposed on the CPU. Furthermore, in an attempt to achieve a conversion device for carrying out the conversion, the device can be achieved by using a small number of circuits including only two registers, a transmit control means and a data selection means; therefore, it is possible to prevent an increase in the LSI circuit scale.

Furthermore, data having a format with an arbitrary bit width can be converted to N-bit format data so that a multi-format converting process can be achieved. Here, in multi-media fields, data-bus sharing that involves various pieces of application software is expected. Under these circumstances, more processes can be simultaneously executed in parallel with each other. With respect to the data memory area required for the CPU to execute multi-media processes, it becomes possible to cut the area.

From the above description it will be apparent that the present invention provides.

What is claimed is:

1. A data transmission method, which processes data through an N-bit bus, comprising the steps of:
    converting M-bit format data, which is a basic data unit for data processing, to N-bit format data, which is a basic data unit for data transmission; and
    transmitting the converted N-bit format data to a data processing device,
    wherein with respect to a conversion system from the M-bit format data to the N-bit format data, first data constituted by first, second and third packets, second data constituted by fourth, fifth and sixth packets, third data constituted by seventh, eighth and ninth packets and fourth data constituted by tenth, eleventh and twelfth packets are inputted, the method comprising:
    a first control process of outputting fifth data constituted by the first, fourth, second and fifth packets;
    a second control process of outputting sixth data constituted by the third and sixth packets;
    a third control process of outputting seventh data constituted by the seventh, tenth, eighth and eleventh packets;
    a fourth control process of outputting eighth data constituted by the ninth and twelfth packets; and
    a fifth control process of inputting the sixth data and, the eighth data and outputting ninth data constituted by third, sixth, ninth and twelfth packets.

2. A data transmission method, which processes data through an N-bit bus, comprising the steps of:
    reading M-bit format data, which is a basic data unit for data processing, from a buffer memory; and
    converting the M-bit format data thus read to N-bit format data, which is a basic data unit for data transmission,
    wherein with respect to a conversion system from the M-bit format data to the N-bit format data, first data constituted by first, second and third packets, second data constituted by fourth, fifth and sixth packets, third data constituted by seventh, eighth and ninth packets and fourth data constituted by tenth, eleventh and twelfth packets are inputted, the method comprising:
    a first control process of outputting fifth data constituted by the first, fourth, second and fifth packets;
    a second control process of outputting sixth data constituted by the third and sixth packets;
    a third control process of outputting seventh data constituted by the seventh, tenth, eighth and eleventh packets;
    a fourth control process of outputting eighth data constituted by the ninth and twelfth packets; and
    a fifth control process of inputting the sixth data and the eighth data and outputting ninth data constituted by third, sixth, ninth and twelfth packets.

3. A data transmission method, which processes data through an N-bit bus, comprising the steps of:
    transmitting N-bit format data, which is a basic data unit for data transmission, from a data processing device; and
    converting the transmitted N-bit format data to M-bit format data, which is a basic data unit for data processing,
    wherein with respect to a conversion system from the N-bit format data to the M-bit format data, first data constituted by first, second, third and fourth packets, second data constituted by fifth, sixth, seventh and eighth packets, and third data constituted by ninth, tenth, eleventh and twelfth packets are inputted, the method comprising:
    a first control process of outputting fourth data constituted by the first, fifth and second packets;
    a second control process of outputting fifth data constituted by the third, seventh and fourth packets;
    a third control process of inputting the second data, and outputting sixth data constituted by the sixth, seventh and eighth packets after carrying out a shifting process to the right by one packet;
    a fourth control process of outputting seventh data constituted by the ninth, sixth and tenth packets; and
    a fifth control process of outputting eighth data constituted by the eleventh, eighth and twelfth packets.

4. A data transmission method, which processes data through an N-bit bus, comprising the steps of:
- converting N-bit format data, which is a basic data unit for data transmission, to M-bit format data, which is a basic data unit for data processing; and
- writing the converted M-bit format data in a buffer memory,
- wherein with respect to a conversion system from the N-bit format data to the M- bit format data, first data constituted by first, second, third and fourth packets, second data constituted by fifth, sixth, seventh and eighth packets, and third data constituted by ninth, tenth, eleventh and twelfth packets are inputted, the method comprising:
- a first control process of outputting fourth data constituted by the first, fifth and second packets;
- a second control process of outputting fifth data constituted by the third, seventh and fourth packets;
- a third control process of inputting the second data, and outputting sixth data constituted by the sixth, seventh and eighth packets after carrying out a shifting process to the right by one packet;
- a fourth control process of outputting seventh data constituted by the ninth, sixth and tenth packets; and
- a fifth control process of outputting eighth data constituted by the eleventh, eighth and twelfth packets.

5. A data transmission method, which processes data through an N-bit bus, comprising the steps of:
- converting N-bit format data, which is a basic data unit for data transmission, to M-bit format data, which is a basic data unit for data processing; and
- writing the converted M-bit format data in a buffer memory,
- wherein with respect to a conversion system from the N-bit format data to the M-bit format data, first data constituted by first, second, third and fourth packets, second data constituted by fifth, sixth, seventh and eighth packets, and third data constituted by ninth, tenth, eleventh and twelfth packets are successively inputted, the method comprising:
- a first data holding step of holding the first, second and third data;
- a second data holding step of holding the fourth, eighth and twelfth packets;
- a data selection step of inputting the data held in the first data holding step; allowing the higher-order one packet to shift to the second data holding step; allowing the lower-order three packets of the first, second and third data to shift to a transmit control step as the fourth, fifth and sixth data; and when, upon completion of the steps, data corresponding to three packets has been stored in the second data holding step, switching steps to shift to the transmit control step with the data being used as the seventh data constituted by the fourth, eighth and twelfth packets; and
- a transmit control step of successively transmitting the fourth, fifth, sixth and seventh data that have been shifted from the data selection step to a buffer memory area.

6. A data transmission method, which processes data through an N-bit bus, comprising the steps of:
- reading M-bit format data, which is a basic data unit for data processing, from a buffer memory; and
- converting the M-bit format data thus read to N-bit format data, which is a basic data unit for data transmission,
- wherein with respect to a conversion system from the M-bit format data to the N-bit format data, first data constituted by first, second and third packets, second data constituted by fourth, fifth and sixth packets, third data constituted by seventh, eighth and ninth packets, and fourth data constituted by tenth, eleventh and twelfth packets are inputted, the method comprising:
- a transmit control step of allowing the sequence to successively proceed to a data selection step together with the first, second, third and fourth data;
- a data selection step of, in the case when, among the data inputted at the transmit control step, the first data is inputted, allowing the sequence to proceed to a second data holding step, and in the case when the second, third and fourth data are inputted, respectively adding the first, second and third packets held at the second data holding step to the higher-order packets to form the fifth, sixth and seventh data, and allowing the sequence to proceed to a first data holding step;
- the first data holding step of holding the fifth, sixth and seventh data outputted from the data selection step; and
- the second data holding step of holding the first data outputted at the data selection step.

7. A data transmission apparatus, which processes data through an N-bit bus, comprising:
- means which converts M-bit format data, which is a basic data unit for data processing, to N-bit format data, which is a basic data unit for data transmission; and
- means which transmits the converted N-bit format data to a data processing device,
- wherein with respect to the conversion system from the M-bit format data to the N-bit format data, first data constituted by first, second and third packets, second data constituted by fourth, fifth and sixth packets, third data constituted by seventh, eighth and ninth packets and fourth data constituted by tenth, eleventh and twelfth packets are inputted, the apparatus comprising:
- first control means which outputs fifth data constituted by the first, fourth, second and fifth packets;
- second control means which outputs sixth data constituted by the third and sixth packets;
- third control means which outputs seventh data constituted by the seventh, tenth, eighth and eleventh packets;
- fourth control means which outputs eighth data constituted by the ninth and twelfth packets; and
- fifth control means which receives the sixth data and the eighth data and outputs ninth data constituted by third, sixth, ninth and twelfth packets.

8. A data transmission apparatus, which processes data through an N-bit bus, comprising:
- means which reads M-bit format data, which is a basic data unit for data processing, from a buffer memory; and
- means which converts the M-bit format data thus read to N-bit format data, which is a basic data unit for data transmission,
- wherein with respect to the conversion system from the M-bit format data to the N-bit format data, first data constituted by first, second and third packets, second data constituted by fourth, fifth and sixth packets, third data constituted by seventh, eighth and ninth packets and fourth data constituted by tenth, eleventh and twelfth packets are inputted, the apparatus comprising:
- first control means which outputs fifth data constituted by the first, fourth, second and fifth packets;
- second control means which outputs sixth data constituted by the third and sixth packets;
- third control means which outputs seventh data constituted by the seventh, tenth, eighth and eleventh packets;

fourth control means which outputs eighth data constituted by the ninth and twelfth packets; and fifth control means which receives the sixth data and the eighth data and outputs ninth data constituted by third, sixth, ninth and twelfth packets.

9. A data transmission apparatus, which processes data through an N-bit bus, comprising:

means which transmits N-bit format data, which is a basic data unit for data transmission, from a data processing device; and means which converts the transmitted N-bit format data to M-bit format data, which is a basic data unit for data processing, wherein with respect to the conversion system from the N-bit format data to the M-bit format data, first data constituted by first, second, third and fourth packets, second data constituted by fifth, sixth, seventh and eighth packets, and third data constituted by ninth, tenth, eleventh and twelfth packets are inputted, the apparatus comprising:

first control means which outputs fourth data constituted by the first, fifth and second packets;

second control means which outputs fifth data constituted by the third, seventh and fourth packets;

third control means which receives the second data, and outputs sixth data constituted by the sixth, seventh and eighth packets after carrying out a shifting process to the right by one packet;

fourth control means which outputs seventh data constituted by the ninth, sixth and tenth packets; and fifth control means which outputs eighth data constituted by the eleventh, eighth and twelfth packets.

10. A data transmission apparatus, which processes data through an N-bit bus, comprising:

means which converts N-bit format data, which is a basic data unit for data transmission, to M-bit format data, which is a basic data unit for data processing; and means which writes the converted M-bit format data in a buffer memory, wherein with respect to the conversion system from the N-bit format data to the M-bit format data, first data constituted by first, second, third and fourth packets, second data constituted by fifth, sixth, seventh and eighth packets, and third data constituted by ninth, tenth, eleventh and twelfth packets are inputted, the apparatus comprises:

first control means which outputs fourth data constituted by the first, fifth and second packets;

second control means which outputs fifth data constituted by the third, seventh and fourth packets;

third control means which receives the second data, and outputs sixth data constituted by the sixth, seventh and eighth packets after carrying out a shifting process to the right by one packet;

fourth control means which outputs seventh data constituted by the ninth, sixth and tenth packets; and fifth control means which outputs eighth data constituted by the eleventh, eighth and twelfth packets.

11. A data transmission apparatus, which processes data through an N-bit bus, comprising:

means which converts N-bit format data, which is a basic data unit for data transmission, to M-bit format data, which is a basic data unit for data processing; and means which writes the converted M-bit format data in a buffer memory, wherein with respect to the conversion system from the N-bit format data to the M-bit format data, first data constituted by first, second, third and fourth packets, second data constituted by fifth, sixth, seventh and eighth packets, and third data constituted by ninth, tenth, eleventh and twelfth packets are successively inputted, the apparatus comprising:

first data holding means which holds the first, second and third data;

second data holding means which holds the fourth, eighth and twelfth packets;

data selection means which receives the data held in the first data holding step, allows the higher-order one packet to shift to the second data holding step, allows the lower-order three packets of the first, second and third data to shift to a transmit control step as the fourth, fifth and sixth data; and when, upon completion of the steps, data corresponding to three packets has been stored in the second data holding step, switches steps to shift to the transmit control step with the data being used as the seventh data constituted by the fourth, eighth and twelfth packets; and transmit control means which successively transmits the fourth, fifth, sixth and seventh data that have been shifted from the data selection step to a buffer memory area.

12. A data transmission apparatus, which processes data through an N-bit bus, comprising:

means which reads M-bit format data, which is a basic data unit for data processing, from a buffer memory; and means which converts the M-bit format data thus read to N-bit format data, which is a basic data unit for data transmission, wherein with respect to the conversion system from the M-bit format data to the N-bit format data, first data constituted by first, second and third packets, second data constituted by fourth, fifth and sixth packets, third data constituted by seventh, eighth and ninth packets, and fourth data constituted by tenth, eleventh and twelfth packets are inputted, the apparatus comprising:

transmit control means which successively transmits the first, second, third and fourth data to data selection means;

data selection means which receives data from the transmit control means, and when the first data is inputted, outputs the data to second data holding means, while, when the second, third and fourth data are inputted, respectively adds the first, second and third packets held at the second data holding means to the higher-order packets thereof to form fifth, sixth and seventh data, and outputs the fifth, sixth and seventh data to first data holding means;

first data holding means which receives and holds the fifth, sixth and seventh data outputted from the data selection means; and second data holding means which receives and holds the first data outputted from the data selection means.

* * * * *